Feb. 20, 1968 R. N. TILLOTSON 3,369,293

METHOD OF MANUFACTURING ETCHED CIRCUITRY

Filed Oct. 29, 1963 2 Sheets-Sheet 1

INVENTOR.
RAYMOND N. TILLOTSON
BY
ATTORNEY

METHOD OF MANUFACTURING ETCHED CIRCUITRY

Filed Oct. 29, 1963

2 Sheets-Sheet 2

INVENTOR.
RAYMOND N. TILLOTSON
BY
Walter J. Jason
ATTORNEY.

United States Patent Office 3,369,293
Patented Feb. 20, 1968

3,369,293

METHOD OF MANUFACTURING ETCHED CIRCUITRY

Raymond N. Tillotson, Santa Monica, Calif., assignor to McDonnell Douglas Corporation, Santa Monica, Calif., a corporation of Maryland Filed Oct. 29, 1963, Ser. No. 319,850
5 Claims. (Cl. 29—625)

This invention relates to a method of manufacturing etched circuitry and more particularly to a new and useful method of producing burr-free holes in double-sided printed circuit boards and printing an electrical circuit thereon.

Etched electrical circuitry has long been employed as a means for efficiently interconnecting electrical or electronic components in a small space. This circuitry generally takes the form of sheets of dielectric material on which strips of a conductive material extend. A plurality of terminal holes and terminal pads are provided on these sheets and serve as attachment means for the components to be connected to these sheets. The holes are interconnected by the terminal pads, the strips of conductive material and by through-hole copper plating.

Heretofore, these terminal holes have been produced by drilling or punching a copper clad sheet of dielectric material. While generally satisfactory, this method of producing the holes has the disadvantage of leaving a small burr where the punch or drill passes through the sheet.

Certain prior art methods of manufacturing etched circuitry also include the step of laying out the circuit, terminal pads and the terminal holes to close tolerances on a masking template to an enlarged scale of four to ten times the size of the printed circuit board, depending upon the size of the board. The masking template layout is then reduced to actual size and a tooling template is made up to serve as a guide in duplicating the position of the laid-out terminal hole locations on the printed circuit board with a drill or the like. This manufacturing step has the disadvantage that the holes drilled, using the tooling template, may not be in proper locations when the circuitry is etched on the board after the drilling operation because of small errors made in preparing the drilling template. Therefore, no tolerances can be allowed for manufacturing errors on the printed circuit board. Also, the circuits may not intersect the terminal holes if the holes are not drilled in accordance with the layout. In addition, the terminal holes may not be concentric within the terminal pads to specified tolerances.

In view of the foregoing factors and conditions characteristic of certain prior art steps in a method of manufacturing etched circuitry, it is a primary object of the present invention to provide a new and useful method of manufacturing etched circuitry not subject to the disadvantages enumerated above and including the step of producing burr-free holes in printed circuit boards efficiently, safely and expeditiously.

Another object of the present invention is to provide a novel method of laying out a printed circuit and terminal hole locations on a copper clad sheet as one step in a novel process for manufacturing etched circuitry.

Yet another object of the present invention is to provide a novel method of producing terminal holes in a printed circuit board, wherein a burr-free hole is produced by etching away the copper clad surfaces in the areas where the holes are to be drilled.

A further object of the present invention is to provide a novel method of manufacturing etched circuitry including the steps of producing a photographic reproduction of the exact locations of terminal holes on a printed circuit board and laying the printed circuit out on the photographic reproduction.

While the invention will be described in connection with a printed circuit board which is copper clad on both sides, it is to be understood that the invention applies equally well to boards which are clad on but one side. It is also to be understood that conductive materials other than copper may be used to clad the boards.

According to the present invention, a proposed, hair-lined printed circuit together with its proposed terminal hole locations are reproduced on a photographic film to ten times normal size. This film is then reduced to a normal sized film which serves as a masking template to photographically reproduce the layout on a drill template. The proposed terminal holes are then drilled in the drill template on an optical mill, drill or any type of precision duplicating machine.

Two exposed sheets of photographic film negative are then placed back-to-back with the black surfaces facing each other and sandwiched between back-up boards. This assembly is placed under the template. An oversize (0.005–0.008 inch) drill is then used to drill the terminal holes through both negatives.

A sheet of sensitized photographic film is then placed beneath each negative and exposed to produce photographic positives constituting matched, hole-locating, masking templates.

The matched positives are used, by conventional photoresist methods, to print the location of the terminal hole areas on both sides of a copper-clad, printed-circuit board by placing one positive on each side thereof. The printed circuit board is then prepared in conventional manner for an etching bath and the copper areas representing the terminal holes are etched out of the copper clad.

A plurality of etched printed circuit boards may then be stacked together and sandwiched between back-up boards. This assembly is placed beneath the drilling template and terminal holes of standard diameters are drilled in the exposed dielectric material in those areas where the copper clad has been etched away. The terminal holes are then through-hole copper plated and the drilled, printed circuit board is placed between normal sized, circuitry masking templates, to be hereinafter described, so that the circuits and terminal pads may be etched on both sides of the board in conventional manner.

In the meantime, the positives which were used to etch out the terminal hole areas on the circuit board are enlarged to from four to ten times their normal sizes and the proposed circuits and terminal pads are laid out thereon using the printed terminal hole areas as guides. These enlarged positives are then reproduced to normal size on sensitized photographic film. This produces the aforementioned normal sized, circuitry masking templates.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
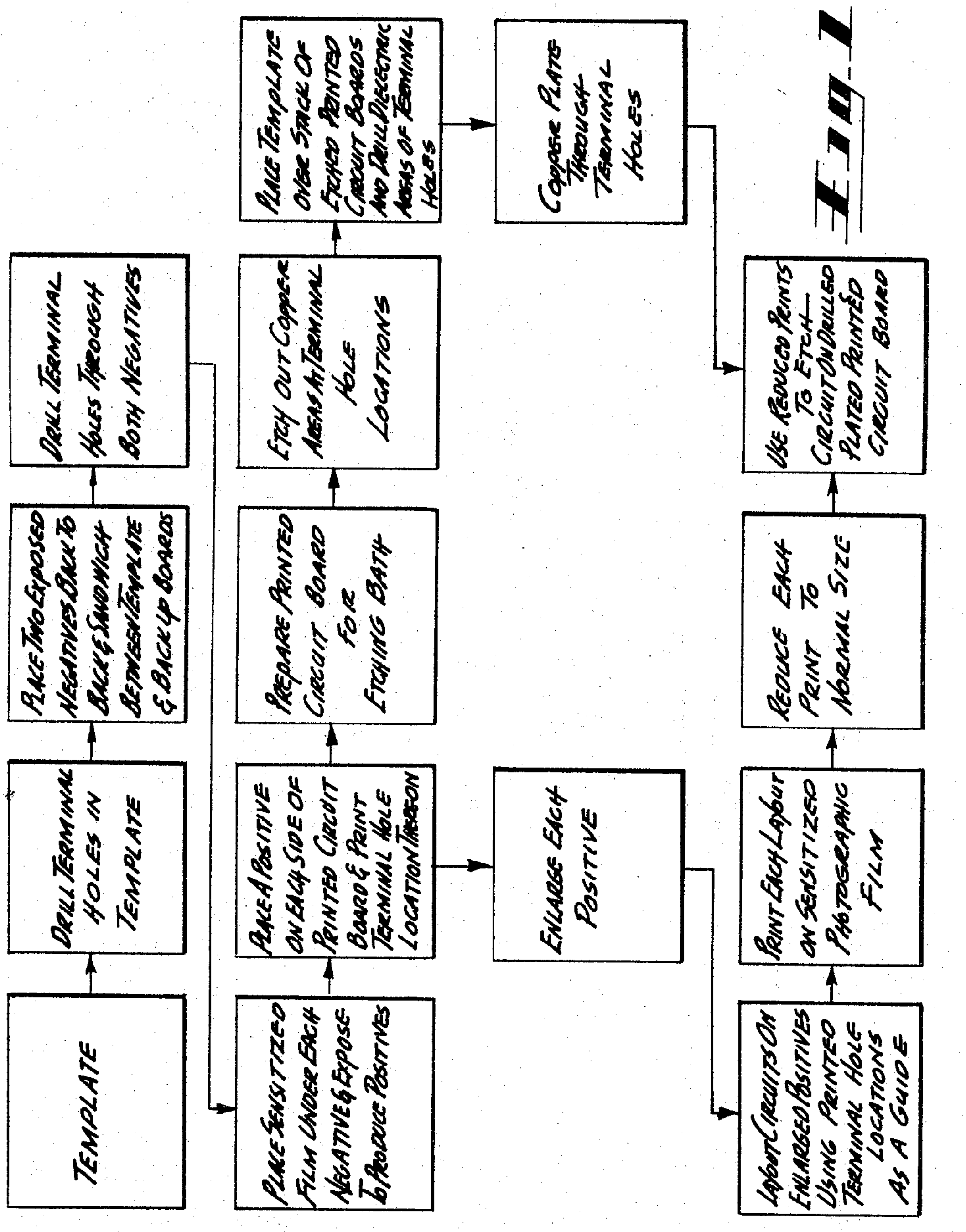
FIGURE 1 is a schematic chart showing the various steps of the present process.

With reference to the drawing wherein like reference characters denote like parts or steps in the present process throughout the several views, FIG. 1 may be utilized as an overall reference while the various other FIGS. 2 through 11, inclusive, disclose particular details of the process.

Figure 2:
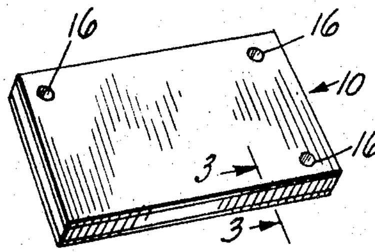
FIG. 2 is an isometric view showing an original sheet of copper clad material.
Figure 3:
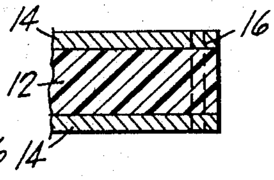
FIG. 3 is an enlarged, fragmentary sectional view of the copper clad material, as taken substantially as indicated by line 3—3 of FIG. 2.

As shown in FIGS. 2 and 3, a copper-clad, dielectric blank from which a printed-circuit board is to be made, is indicated generally at 10. This blank comprises a centrally-disposed, dielectric core 12 having sheets of copper 14 applied thereto in any suitable manner. The particular printed circuit board blanks herein shown are generally available and form no individual part of the present invention. In the drawings the various thicknesses of the materials and layers thereon have been exaggerated for clarity with the actual thickness of the copper sheets being relatively thin.

The printed circuit board blank 10 is provided with three tooling holes 16 for a purpose to be hereinafter described.

Figure 4:
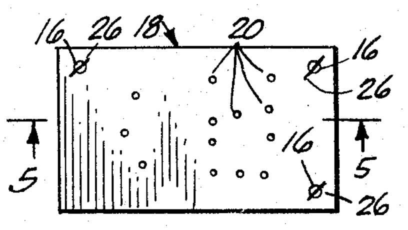
FIG. 4 is a plan view showing a drilling template after having been punched or drilled with a plurality of terminal holes in a suitable pattern.

The first step in the process of providing the printed circuit board blank 10 with a plurality of terminal holes, terminal pads and a printed circuit is to prepare a template 18, as shown in FIG. 4. The template 18 is the same size peripherally as the printed circuit board blank 10 and includes three tooling holes 16 matching the tooling holes 16 in the printed circuit board blank 10. The template 18 is also provided with a plurality of terminal locating holes 20 which may be drilled through the template 18 in accordance with known procedures and which conform to a predetermined pattern.

Figure 5:
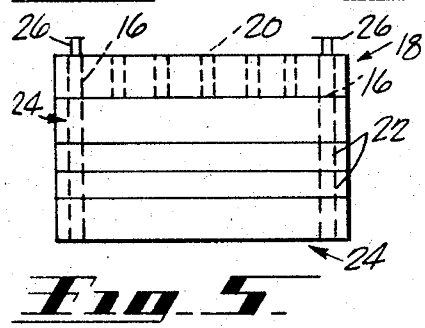
FIG. 5 is an enlarged, cross-sectional view taken substantially as indicated by line 5—5 of FIG. 4.

A pair of exposed, photographic film negatives 22 are placed in back-to-back relationship with their black surfaces, i.e., surfaces having exposed silver nitrate thereon, facing each other. The negatives 22 and a pair of back-up boards 24 are also provided with tooling holes 16 so that the template 18, the negatives 22 and the back-up boards 24 may be accurately aligned when stacked as shown in FIG. 5. A pin 26 may be inserted through the tooling holes 16 to maintain the stacked relationship, while the template 18 is employed as a guide and a 0.005–0.008 inch oversize drill is used to drill the holes 20 through both film negatives 22.

Figure 6:
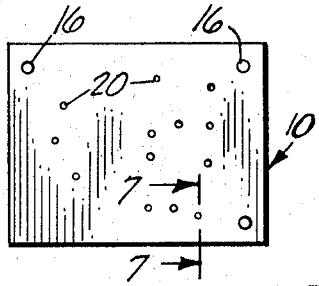
FIG. 6 is a plan view of the printed circuit board of FIG. 2 after a plurality of terminal holes have been printed thereon.
Figure 7:
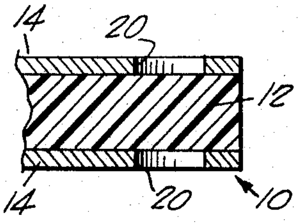
FIG. 7 is an enlarged, fragmentary sectional view taken substantially as indicated by line 7—7 of FIG. 6.

A sheet of sensitized, photographic film having the tooling holes 16 may then be placed under each negative 22 and exposed to produce a pair of masking templates having the terminal holes 20 printed thereon. This produces a pair of positives, not shown, which are used to print the location of the terminal hole areas 20 on each side of the board 10. This is done by first applying a photoresist onto the circuit board blank 10, matching the tooling holes of the positive to the tooling holes of the board. Thereafter a light hardens the resist over the transparent portions of the positive, leaving the terminal hole areas in a condition to be washed free of resist to expose the metal surface of the blank 10. This preparation is a common and well-known technique. Board blank 10 is then treated in an etching bath until all of the copper is etched away from the areas corresponding to terminal holes 20, as shown in FIGS. 6 and 7. This produces holes in the metal which are burr-free.

Figure 8:
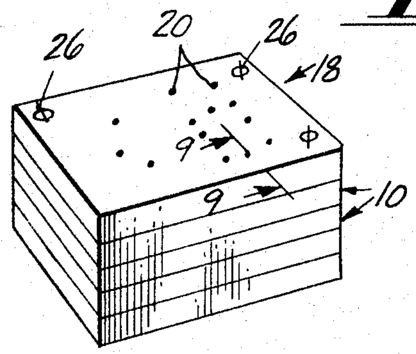
FIG. 8 is an isometric view showing a plurality of etched, printed circuit boards underlying the drilling template of FIG. 4.
Figure 9:
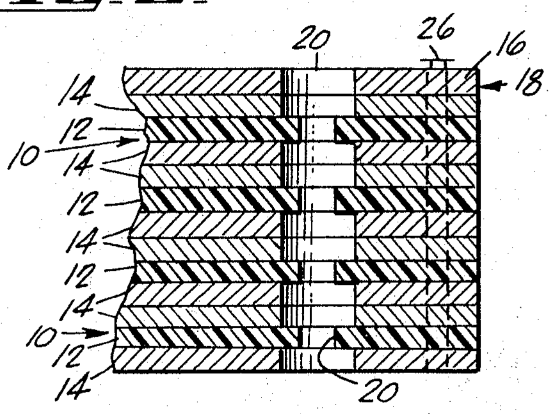
FIG. 9 is an enlarged, fragmentary sectional view taken substantially as indicated by line 9—9 of FIG. 8.

A plurality of blanks 10 having the terminal holes 20 etched therefrom may then be stacked vertically, as shown in FIGS. 8 and 9, and the template 18 secured in position on top thereof by tooling pins 26 engaging the tooling holes 16. The template 18 is then used as a guide while a standard size drill is employed to drill the terminal holes 20 through the dielectric portion 12 of each printed circuit board 10. The etched away areas of the holes 20 are somewhat larger than the dielectric areas. This facilitates inspecting the dielectric areas for de-laminations or crazing.

Figure 10:
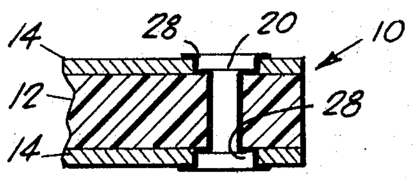
FIG. 10 is a cross-sectional view of one of the terminal holes of FIG. 9 after it has been through-hole copper plated.

Each printed circuit board 10 is then plated in a copper plating bath to provide the terminal holes 20 with a through-hole copper layer 28 (FIG. 10).

Figure 11:
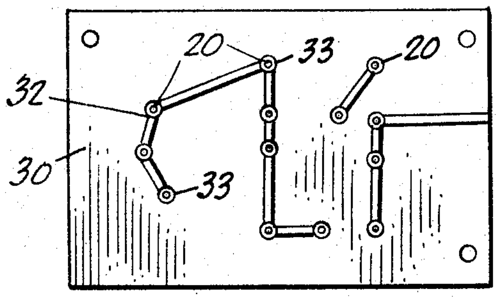
FIG. 11 is a plan view of an enlarged photographic print having a proposed printed circuit and terminal pads laid out thereon.

During performance of the aforementioned etching, drilling and plating steps, the positive prints which were employed to print the holes 20 on circuit board 10 may be enlarged to four times their normal sizes. The enlarged positives will then show the terminal holes 20 in their actually drilled positions. One such enlarged positive is shown in FIG. 11 and is indicated generally as 30. An electrical circuit 32 and terminal pads 33 may then be laid out on each enlarged positive 30 employing conventional ink or tape methods and using the printed terminal holes 20 as guides. Each laid-out circuit 32 and the terminal pads 33 are then printed on sensitized photographic film and reduced to normal size. These normal size prints, not shown, are then employed to print a respective circuit on an associated side of the drilled, plated printed circuit board blank 10.

The blanks 10 may then be etched in conventional manner to expose the printed circuit thereon.

While the particular method of manufacturing etched circuitry herein shown and described in detail is fully capable of attaining the objects and providing the advantages hereinbefore stated, it is to be understood that it is merely illustrative of the presently preferred embodiment of the invention and that no limitations are intended to the details of construction or design herein shown and the method steps herein described other than as defined in the appended claims.

I claim:

1. A method of manufacturing burr-free terminal holes in printed circuit boards of the type having a sheet of dielectric material underlying a sheet of conductive material, comprising, in combination, the steps of:

photographically reproducing the location of terminal hole areas on said conductive sheet;

etching away said conductive sheet only in said terminal hole areas to render etched areas of desired diameters; and mechanically drilling terminal holes respectively of a diameter less than said desired diameter through the dielectric material underlying said etched areas, and spaced from the edges thereof;

said terminal holes being smaller in diameter than holes formed in said conductive material by said etching.

2. A method of manufacturing etched circuitry comprising, in combination, the steps of:

drilling a plurality of holes through a template, said holes corresponding in number and arrangement to the terminal holes for said circuitry;

placing an exposed photographic negative between said template and a back-up board;

drilling said terminal holes through said negative employing said template as a guide;

exposing a sensitized sheet of photographic film under said negative to produce a positive having said terminal hole arrangement printed thereon;

transferring said printed terminal hole arrangement to a printed circuit board having a dielectric portion clad with a conductive material;

laying out a circuit on an enlargement of said positive using said printed terminal hole arrangement as a guide;

printing said layout on sensitized photographic film;

reducing said printed layout to normal size;

etching away the areas of said conductive material underlying said printed terminal hole arrangement on said printed circuit board;

mechanically drilling terminal holes through said dielectric portion in areas underlying said etched away areas;

said terminal holes being smaller in diameter than holes formed in said conductive material by said etching;

through-plating said terminal holes;

transferring said layout from said normal size printed layout to said drilled and plated printed circuit board; and etching away said conductive material in predetermined areas to expose said circuit.

3. A method of producing burr-free terminal holes in a printed circuit board of the type having a dielectric material clad on both sides with a conductive material comprising, in combination, the steps of:

placing two photographic, exposed negatives back-to-back with the silver nitrate surfaces facing each other;

drilling a plurality of holes through both negatives, said holes corresponding in number and location to the terminal holes to be provided in said printed circuit board;

exposing a sheet of sensitized, photographic film under each of said negatives to produce a pair of positives;

photographically exposing each side of said printed circuit board to an associated positive to reproduce said terminal hole locations thereon;

etching away the conductive material underlying said printed, terminal hole locations on said printed circuit board; and mechanically drilling terminal holes in the dielectric areas underlying said etched-out conductive material areas;

said terminal holes being smaller in diameter than holes formed in said conductive material by said etching.

4. The method of claim 3 including the steps of:

enlarging each of said positives to several times their normal sizes;

laying out a predetermined circuit on each of said enlarged positives using said printed terminal hole locations as a guide;

reducing said printed layouts to normal size; and contact printing each of said circuit layouts on a respective side of said drilled printed-circuit board with said reduced prints.

5. The method of claim 4 wherein the peripheral edges of said terminal holes are concentric with and spaced from the peripheral edges of their associated etched areas.

References Cited

UNITED STATES PATENTS

| | | | |
|---|---|---|---|
| 2,990,310 | 6/1961 | Chan | 29—155.5 |
| 2,977,228 | 3/1961 | Gold et al. | 96—35 |
| 3,186,883 | 6/1965 | Frantzen | 174—68.5 |
| 3,265,546 | 8/1966 | Medford | 29—155.5 X |

FOREIGN PATENTS

| | | |
|---|---|---|
| 784,673 | 10/1957 | Great Britain. |

OTHER REFERENCES

"Plated Thru Hole Reliability," by Alan P. Kingsburg, June 1 meeting of Institute of Radio Engineers Professional Group, pp. 1–3.

JOHN F. CAMPBELL, *Primary Examiner.*

R. W. CHURCH, *Assistant Examiner.*